United States Patent [19]

Eberwein et al.

[11] 3,996,430

[45] Dec. 7, 1976

[54] KEYBOARD SWITCH ASSEMBLY HAVING MULTILAYER PRINTED CIRCUIT STRUCTURE

[75] Inventors: Helmut Eberwein, Brendlorenzen; Wolfgang Scherzer, Bad Neustadt, Saale, both of Germany

[73] Assignee: Preh Elektrofeinmechanische Werke, Bad Neustadt, Saale, Germany

[22] Filed: May 2, 1975

[21] Appl. No.: 574,081

[30] Foreign Application Priority Data

May 7, 1974 Germany .................... 7415872[U]

[52] U.S. Cl. .......................... 200/5 A; 200/159 A; 200/275; 200/292; 174/68.5; 317/101 B

[51] Int. Cl.² .................. H01H 9/00; H01H 13/52; H05K 1/00

[58] Field of Search .............. 200/5 R, 5 A, 67 DB, 200/86 R, 159 B, 159 A, 275, 340, 292; 174/68.5; 317/101 B

[56] References Cited

UNITED STATES PATENTS

| | | | |
|---|---|---|---|
| 3,133,170 | 5/1964 | Nanninga | 200/67 DB |
| 3,240,885 | 3/1966 | Grunfelder et al. | 200/5 A |
| 3,584,162 | 6/1971 | Krakinowski | 200/159 B X |
| 3,600,528 | 8/1971 | Leposavic | 200/159 B X |
| 3,617,666 | 11/1971 | Braue | 200/86 R |
| 3,742,157 | 6/1973 | Leposavic | 200/159 B X |
| 3,796,843 | 3/1974 | Durkee et al. | 200/159 B X |
| 3,800,104 | 3/1974 | Lien et al. | 200/5 A |
| 3,806,673 | 4/1974 | Boulanger | 200/5 A |
| 3,831,063 | 8/1974 | Keough | 200/159 B X |
| 3,856,998 | 12/1974 | Sims, Jr. | 200/5 A |
| 3,860,771 | 1/1975 | Lynn et al. | 200/5 A |
| 3,870,840 | 3/1975 | Rivetta et al. | 200/5 A |
| 3,886,012 | 5/1975 | Slater | 200/5 A X |

*Primary Examiner*—James R. Scott
*Attorney, Agent, or Firm*—Cushman, Darby & Cushman

[57] ABSTRACT

An ultrasonic remote control device of the type having an integrated switching network formed in a multilayer printed circuit and mechanical switching means whereby at least some of the circuit connection paths intersect in a cross connection matrix with the switching means manually operable to connect each intersecting path to a common potential, for example ground.

5 Claims, 11 Drawing Figures

Fig.2
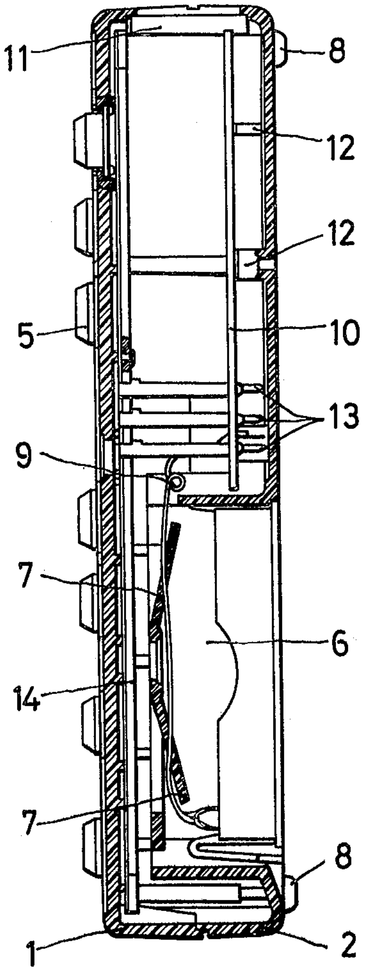
Fig.1
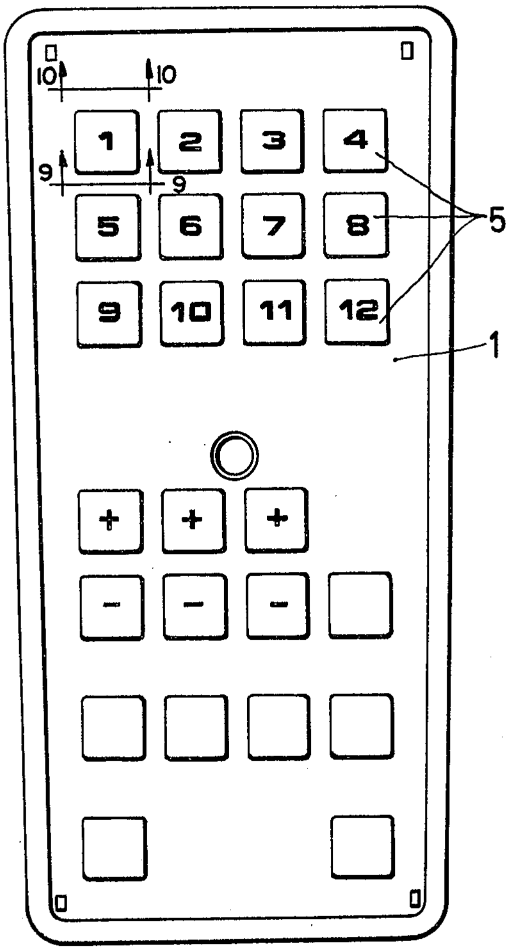
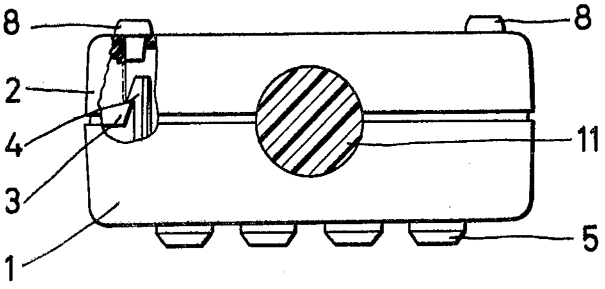
Fig.3

Fig.7
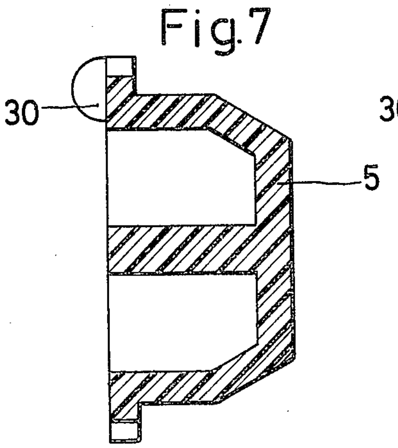
Fig.8
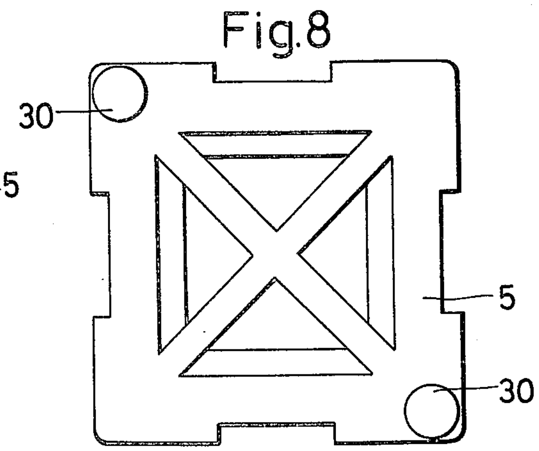
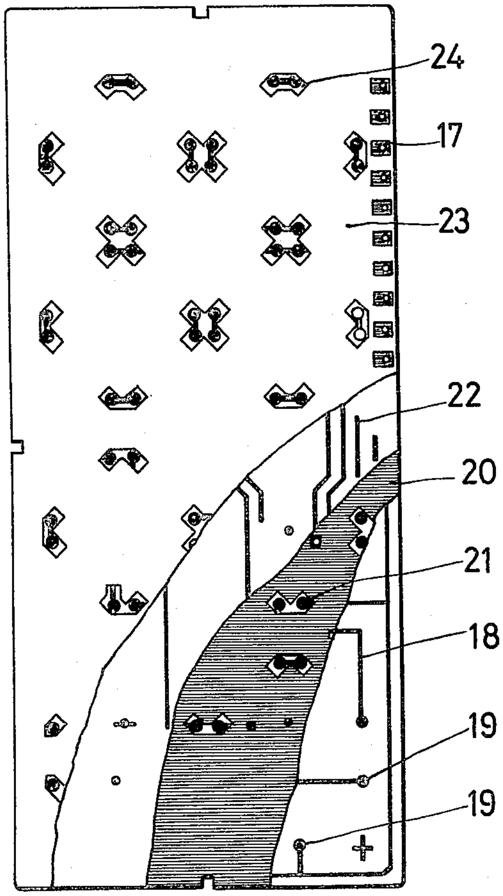
Fig. 6

KEYBOARD SWITCH ASSEMBLY HAVING MULTILAYER PRINTED CIRCUIT STRUCTURE

The invention relates to an ultrasonic remote control device with integrated switching networks.

This type of remote control device employs ultrasonic frequencies, which are usually produced by a battery fed control signal transmitter. In the case of newer models, the television channels can be dialed directly, without having to pass through the programs in between. Further, color saturation, brightness and volume, normally controlled by adjusting voltage values manually on the television receiver with the help of a slide resistance, can be changed from a distance. The television receiver can, in addition, be turned off and on. The ultrasonic receiver stays ready to receive upon being switched off, waiting so that by activation of a program selector key, the instrument is switched on and the corresponding program appears. The picture tube is kept heated during the waiting phase, so that picture and sound appear almost without delay after being switched on.

The selection of the programs and the change of the voltage values takes place with conventional remote control devices, by means of pressure and rocker contacts. If the operator presses the forward half of the rocker, then the voltage value is increased, and it decreases when one activates the rear half of the rocker.

Furthermore, other remote controls are known, with which the functions are triggered not over a switch mechanism but over sensor surfaces.

Moreover, it is known in the case of remote controls to employ integrated switching networks, which are used in connection with individual circuits determining frequency and with a key set.

By the application of an integrated switching network of the new type, which already contains the circuits determining the frequency, it is necessary to adapt the key set to the switching network.

The problem is solved according to the invention of this application whereby a part of the conductor paths from the outlets or inlets of an integrated switching network is arranged in a cross connection matrix in a multilayer printed circuit and at every crossing each of the two conductor paths can be connected simultaneously over mechanical switching arrangements to a common potential, as for example, a ground potential. The entire assembly of the remote control device thus becomes more compact and more functions can be accommodated in a casing of the same size.

Advantageously, the invention provides that the circuit with the conductor paths and contact places consists of an insulating material mounting plate on which the conductor paths and the contact places are impressed in screen printing techniques. An insulating layer is printed thereupon with openings for the contact places and conductor paths on predetermined places. Further conductor paths are printed on this insulating layer, which contact with the conductor paths of the lower layer at determined openings. Another insulating layer is provided thereon, which has openings for the contact positions at predetermined positions, and the mechanical switching arrangement is disposed on this other insulating layer.

A further development of the invention provides that the mechanical switching arrangement consists of a range spacer, over which there is a conductive switching plate, of which free-cut contact reeds are moved by two key projections, which are disposed exactly diagonally of each other at two opposite corners of a four-cornered key. The contact reeds have the same length and are arranged in circles or partial circles with their free ends extending towards the center of the circle, whereby a contact reed is assigned to the center of every quadrant sector so that with a semicircle, the angle between two contact reeds is approximately a right angle.

In this embodiment of the invention, on pressing a key the contact places of the insulating material mounting plate are contacted by two contact reeds of different circle or sector groupings.

In the drawings:

FIG. 1 shows a plan view of an ultrasonic remote control device;

FIG. 2 shows a longitudinal section through this unit;

FIG. 3 shows a view of the front side of this unit;

FIG. 6 shows a top view of the printed switching network;

FIG. 7 is a section through a key;

FIG. 8 shows a view from below this key;

Figure 5:
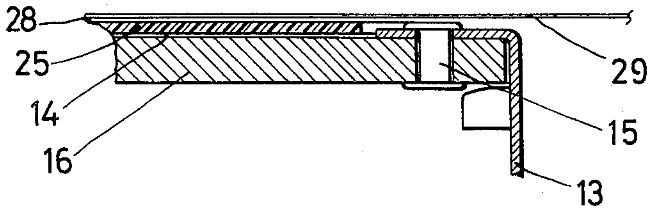
FIG. 5 shows a partial section of the switching arrangement.

The ultrasonic remote control device consists of two plastic casing half shells 1 and 2 which are held together by means of familiar snap catches 3 and 4. In the upper half of shell 1, as shown in FIG. 1, keys 5 are arranged in several rows over each other. Since the remote control is to operate without cable connection to a power supply, in a lower half of shell 2 a battery is placed. In order that this battery has a firm base, spring tongues 7 are formed integrally with the upper half shell, with the help of which the battery is pressed on the lower half shell. The lower half shell has openings not visible in the figures through which the battery can be inserted. The battery is connected with the other parts of the electronic circuit by cable 9.

In the four corners of the lower half shell rubber feet 8 are pressed into holes, in order to ensure a better support of the unit on a smooth base.

Whereas the battery is in the lower half of the lower half shell 2, the electronic circuit for the ultrasonic transmitter is placed in the upper half thereof. The printed circuit plate for this transmitter is designated 10 in FIG. 2. The individual elements and the integrated switching network with the corresponding conductor paths are provided on plate 10.

On one front side, both half shells have a half round recess, in which an ultrasonic transducer 11 is visible, which is connected electrically with the printed circuit plate 10. Printed circuit plate 10 is supported on projecting catches and shoulders 12, which are in the vicinity of lower half shell 2. Through flexible contact bars 13 soldered in the printed circuit plate 10, a second printed circuit 14 is electrically connected to plate 10. In FIG. 2 only three of several contact bars 13 are shown to avoid cluttering the drawings. Contact bars 13 are, as is more perceptible from FIG. 5, connected by rivets 15 to an insulating material mounting plate 16. The corresponding terminals are designated with 17 in FIG. 6.

On this isolating material mounting plate 16, which can consist of a hard paper, conductor paths 18 and round contact points 19 are applied in conventional screen printing procedure. Over than an insulating layer 20 is applied, in a further printing procedure and at previously determined places, openings 21 for the contact places and are provided through layer 20. On this insulated layer 20 conductor paths 22 are placed in a subsequent printing process, which contact at openings 21 with the conductor paths beneath them. Consequently, in this way, a conductor path matrix is produced, the crossings of which can be connected simultaneously to a common potential by a conventional mechanical switching arrangement. Because of the type of integrated switching network used, ground potential is required. Over these conductor paths 22, finally a further insulating layer 23 is laid by means of a printing technique with openings 24 at the contact places.

Figure 4:
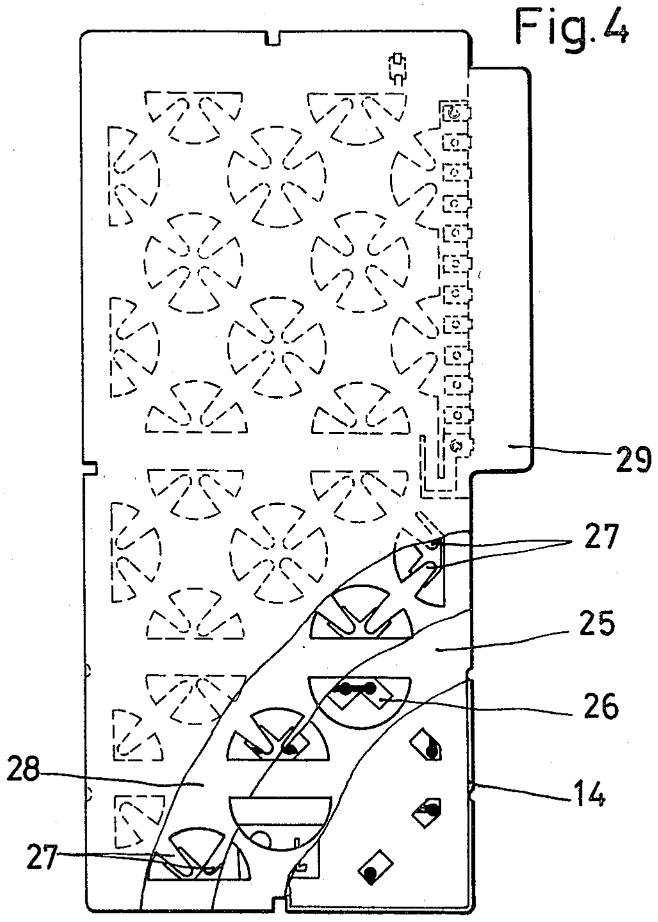
FIG. 4 shows a top view of the mechanical switching arrangement of this unit.
Figure 9:
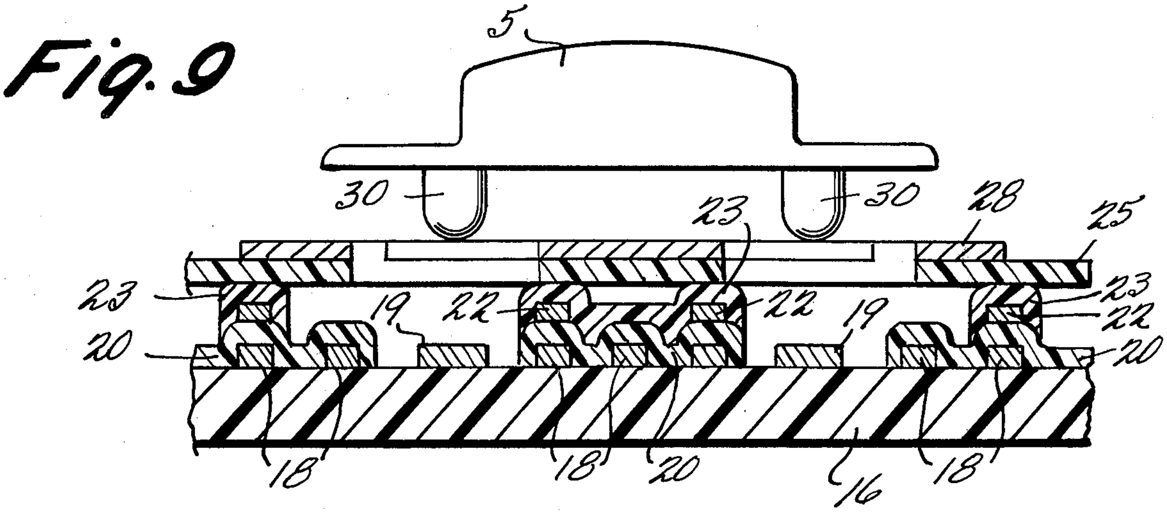
FIG. 9 shows a sectional view of the key and switch assembly along the lines 9—9 in FIG. 1.
Figure 10:
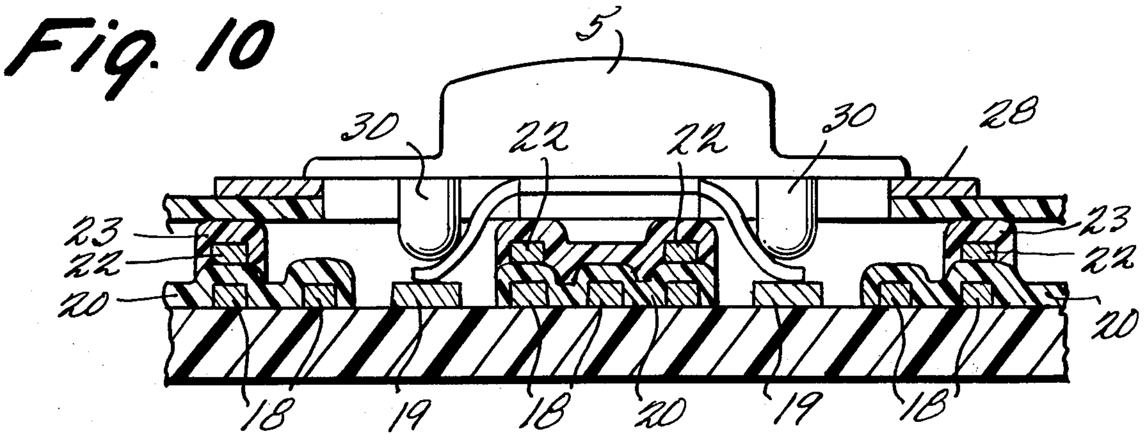
FIG. 10 shows a sectional view along the lines 9—9 with the key depressed.
Figure 11:
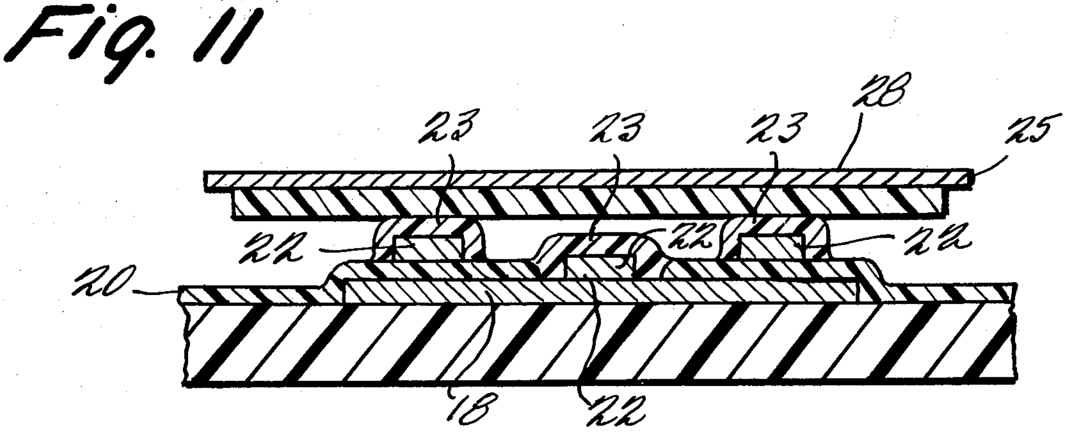
FIG. 11 shows a sectional view along the lines 11—11 in FIG. 1.

The mechanical switching arrangement is formed by an insulating range spacer 25, which has slots 26 for contact reeds 27. The contact reeds themselves are cut free from a metal switching plate 28, which is over the range spacer. In FIG. 4, several possibilities of arrangements of the contact reeds are exhibited in dashed lines. The contact reeds are all of the same length, arranged in circles or semicircles. Their free ends point to the middle of the circle. Every quadrant has a contact reed in its middle, so that in the case of a semicircle the angle between two contact reeds is approximately a right angle.

A thin foil 29 is placed over this switching network as a protection against dust. The four cornered keys 5 shown in FIGS. 7 and 8 have two integrally formed key projections 30 on their bottom surfaces on two opposite corners. When assembled, the keys are arranged in upper half shell 1 in such a way that both key projections can activate the respective contact positions of two different adjacent circle or sector arrangements.

If a key is pressed, then two intersecting conductor paths are jointly connected by two contact reeds to the switching plate potential. As verification that a key is pressed, an indicator device, for example, in the form of a light emitting diode can be provided in the upper half shell.

Many changes and modifications in the above-described embodiment of the invention can of course be carried out without departing from the scope thereof. Accordingly, that scope is intended to be limited only by the scope of the appended claims.

What is claimed is:

1. In a ultrasonic remote control device with integrated switching networks formed in a multilayer printed circuit, a keyboard having a plurality of keys and mechanical switching means, the improvement of a keyboard switch assembly wherein a part of the conductor paths from the outlets and/or inlets of said integrated switching network is arranged in a cross connection matrix in said multilayer printed circuit, said printed circuit including the conductor paths and the contact places comprising an insulated material mounting plate on which first ones of the conductor paths and contact places are applied in the screen printing technique, a first insulating layer printed thereon, which has openings for the contact places and for the conductor paths at predetermined places, second ones of the conductor paths being printed, on the first insulating layer for contacting at determined openings the conductor paths of the lower layer, a second insulating layer provided on the first insulating layer and the second conductor paths and having at predetermined places openings for the contact places and that the mechanical switching arrangement is disposed upon the second insulating layer, wherein said mechanical switching means comprises a plurality of elongated flexible contact reeds mounted so as to be movable by said keys into contact with said printed circuit, and whereby at every intersection each of the two conductor paths can be simultaneously connected by said mechanical switching means to a common potential.

2. In an ultrasonic remote control device according to claim 1 wherein said mechanical switching means comprises a range spacer over which there is a conductive switching plate of which free-cut contact reeds are movable by two key projections disposed exactly diagonally at two opposite corners of a four-cornered key.

3. In an ultrasonic remote control device according to claim 1 wherein the contact reeds have equal lengths and are arranged in a circle or sector with their free ends extending toward the middle of the circle, one contact reed being centrally assigned to every quadrant so that with a semi-circle, the angle between the two contact reeds is substantially a right angle.

4. In an ultrasonic remote control device according to claim 1 wherein on depression of a key the contact places of the insulating material mounting plate are contacted by two contact reeds from different circle or partial circle groupings.

5. In an untrasonic remote control device according to claim 1 wherin said common potential is ground.

* * * * *